(12) United States Patent
Wampler, II et al.

(10) Patent No.: US 12,000,901 B2
(45) Date of Patent: Jun. 4, 2024

(54) BATTERY STATE ESTIMATION BASED ON MULTIPLE RATES OF HYSTERESIS TRANSIT

(71) Applicant: GM GLOBAL TECHNOLOGY OPERATIONS LLC, Detroit, MI (US)

(72) Inventors: Charles W. Wampler, II, Birmingham, MI (US); Thanh-Son Dao, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/679,380

(22) Filed: Feb. 24, 2022

(65) Prior Publication Data

US 2023/0266396 A1 Aug. 24, 2023

(51) Int. Cl.
*G01R 31/3842* (2019.01)
*B60L 58/12* (2019.01)

(52) U.S. Cl.
CPC .......... *G01R 31/3842* (2019.01); *B60L 58/12* (2019.02); *B60L 2240/547* (2013.01); *B60L 2240/549* (2013.01)

(58) Field of Classification Search
CPC ................. G01R 31/3842; B60L 58/12; B60L 2240/547; B60L 2240/549
USPC ....................................................... 324/427
See application file for complete search history.

(56) References Cited

U.S. PATENT DOCUMENTS

| | | | |
|---|---|---|---|
| 10,901,042 B2 | 1/2021 | Verbrugge et al. | |
| 10,928,457 B2 | 2/2021 | Wampler, II | |
| 10,928,459 B2 | 2/2021 | Sun et al. | |
| 2002/0117997 A1 | 8/2002 | Feil et al. | |
| 2003/0076109 A1* | 4/2003 | Verbrugge | G01R 31/392 324/427 |
| 2010/0321025 A1* | 12/2010 | Lin | H01M 10/4207 324/427 |
| 2015/0253389 A1* | 9/2015 | Arai | G01R 31/3828 324/427 |
| 2015/0276885 A1* | 10/2015 | K.R. | G01R 31/367 702/63 |
| 2016/0216336 A1 | 7/2016 | Ishii | |
| 2018/0306865 A1* | 10/2018 | Verbrugge | G01R 31/3835 |
| 2021/0215769 A1* | 7/2021 | Chow | H01M 10/0565 |

FOREIGN PATENT DOCUMENTS

CN 104535932 A * 4/2015

OTHER PUBLICATIONS

U.S. Appl. No. 17/589,053, filed Jan. 31, 2022, Wampler, II.

* cited by examiner

*Primary Examiner* — Giovanni Astacio-Oquendo

(57) ABSTRACT

A system for an electric vehicle includes a hysteresis module configured to calculate a plurality of hysteresis state components of a battery based on a measured current and a respective hysteresis transit rate, calculate an overall hysteresis state of the battery based on the plurality of hysteresis state components, and calculate a hysteresis voltage of the battery based on the overall hysteresis state, and a state of charge (SOC) module configured to calculate an SOC of the battery based in part on the hysteresis voltage.

11 Claims, 5 Drawing Sheets

BATTERY STATE ESTIMATION BASED ON MULTIPLE RATES OF HYSTERESIS TRANSIT

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicles and, more particularly, to battery systems of vehicles.

Some types of vehicles include only an internal combustion engine that generates propulsion torque. Pure electric vehicles include a battery system and an electric motor. Hybrid vehicles include both an internal combustion engine and one or more electric motors and may include a battery system. The battery system includes one or more batteries or battery modules. Each battery module includes one or more battery cells.

SUMMARY

A system for an electric vehicle includes a hysteresis module configured to calculate a plurality of hysteresis state components of a battery based on a measured current and a respective hysteresis transit rate, calculate an overall hysteresis state of the battery based on the plurality of hysteresis state components, and calculate a hysteresis voltage of the battery based on the overall hysteresis state, and a state of charge (SOC) module configured to calculate an SOC of the battery based in part on the hysteresis voltage.

In other features, the hysteresis module is configured to calculate the plurality of hysteresis state components based on a C-rate associated with the measured current. The hysteresis module includes a plurality of rate modules configured to output the plurality of hysteresis state components based on the hysteresis transit rates. The plurality of hysteresis state components are transit variables. The hysteresis module is configured to calculate the plurality of hysteresis components based on lagged currents associated with the measured current. The hysteresis module is configured to calculate the plurality of hysteresis components based on respective relaxation factors assigned to the lagged currents. The relaxation factors correspond to relaxation of hysteresis voltage subsequent to stopping charging or discharging of the battery. The relaxation factors are relaxation weights.

In other features, the hysteresis module is configured to calculate the overall hysteresis state based on a weighted sum of the plurality of hysteresis state components. The hysteresis module is configured to calculate the weighted sum based on a plurality of weighting factors and a sum of the plurality of weighting factors is 1. The hysteresis module is configured to calculate the hysteresis voltage further based on a voltage gap. The hysteresis module is configured to calculate the hysteresis voltage based on a product of the hysteresis state and the voltage gap. A vehicle includes the system.

A method for operating an electric vehicle includes calculating a plurality of hysteresis state components of a battery based on a measured current and a respective hysteresis transit rate, calculating an overall hysteresis state of the battery based on the plurality of hysteresis state components, calculating a hysteresis voltage of the battery based on the overall hysteresis state; and calculating an SOC of the battery based in part on the hysteresis voltage.

In other features, the method further includes calculating the plurality of hysteresis state components based on a C-rate associated with the measured current. The method further includes calculating the plurality of hysteresis components based on lagged currents associated with the measured current. The method further includes calculating the plurality of hysteresis components based on respective relaxation factors assigned to the lagged currents. The relaxation factors correspond to relaxation of hysteresis voltage subsequent to stopping charging or discharging of the battery. The relaxation factors are relaxation weights.

In other features, the method further includes calculating the overall hysteresis state based on a weighted sum of the plurality of hysteresis state components. The method further includes calculating the weighted sum based on a plurality of weighting factors and a sum of the plurality of weighting factors is 1. The method further includes calculating the hysteresis voltage further based on a voltage gap.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
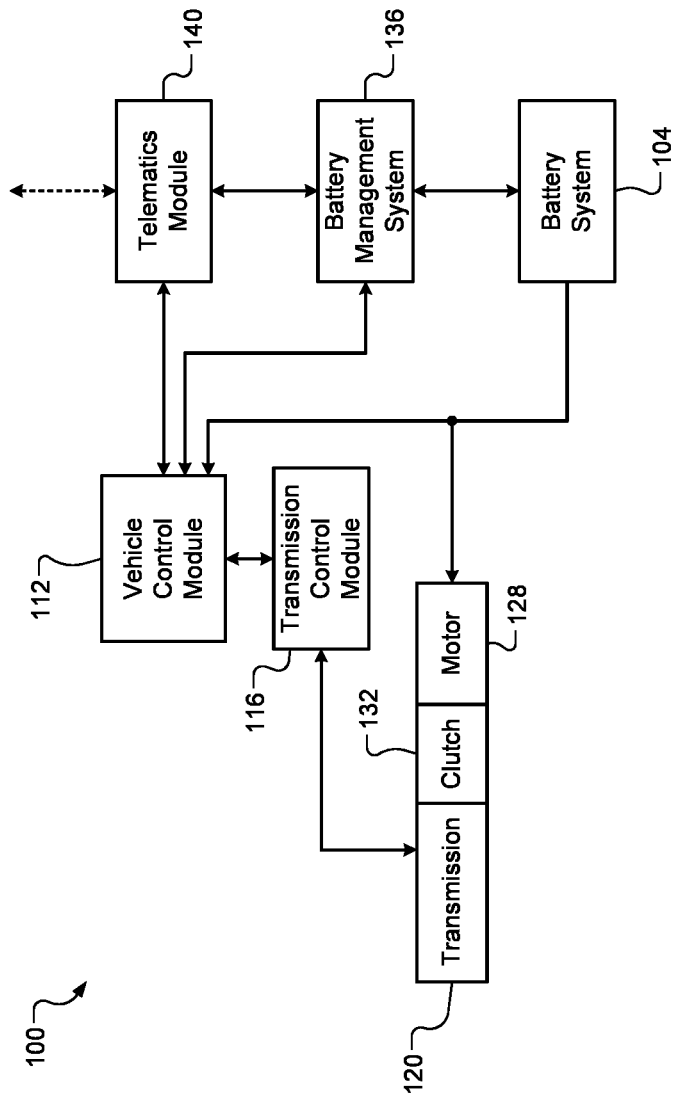
FIG. 1 is a functional block diagram of an example vehicle system according to the present disclosure.

Electric or hybrid electric vehicles typically include a battery system comprised of one or more rechargeable batteries or battery modules each including a plurality of battery cells (e.g., arranged in one or more battery packs). A battery management system (BMS) monitors various parameters of the battery system and controls the operation of the battery system. For example, the battery cells include solid or liquid electrolyte arranged between an anode and a cathode of the battery cell. Over the lifetime of the battery, performance of the battery may decrease due to one or more of electrolyte dry out, chemistry changes of the solid or liquid electrolyte, loss of active lithium, changes in the active materials of the battery cells, etc.

The BMS may be configured to calculate a battery state (e.g., a state of charge (SOC)) of the battery system. For example, the BMS may include (or, alternatively, communicate with) a battery state estimation module configured to estimate or calculate the SOC of the battery system. The battery state estimation module may estimate the SOC based on battery characteristics including, but not limited to, measured current, temperature, measured terminal voltage, a voltage predicted by a battery state model, etc. In some examples, the battery state model calculates the predicted voltage based on (e.g., a sum of) an open circuit voltage, a hysteresis gap or voltage, and an overpotential or overvoltage.

The overpotential may be modeled in accordance with an equivalent circuit such that a total overpotential is a sum of voltages across a resistor and a plurality of resistor capacitor (RC) pairs. In other examples, the equivalent circuit is replaced by a bank of low-pass filters, each having a predetermined time constant, that output lagged versions of a measured input current (i.e., lagged currents). The measured input current and each of the lagged currents is multiplied by a resistance to determine a respective voltage component, and the respective voltage components are summed to calculate the total overpotential. An example model of overpotential based on lagged current is described in more detail in U.S. Pat. No. 10,928,457, the entirety of which is incorporated herein by reference.

Conversely, the hysteresis voltage corresponds to a difference between a voltage during slow (i.e., low C-rate) charging and a voltage during slow discharging, which may vary based on the SOC of the battery, temperature, battery type and materials, etc. For a given measured voltage (e.g., an open circuit voltage (OCV)) of the battery, there is a large range of possible stable SOC values for the battery depending upon whether the battery has most recently been charging or discharging. Accordingly, the hysteresis voltage may be modeled to facilitate accurate estimation of SOC and other battery characteristics. Hysteresis voltage is described in more detail in U.S. Pat. No. 10,901,042, the entirety of which is incorporated herein by reference.

Hysteresis transit corresponds to a transition from one side of the hysteresis gap (e.g., a charging or discharging voltage) to the other side of the hysteresis gap (e.g., a discharging or charging voltage). Accordingly, a hysteresis transit rate corresponds to a rate at which the measured voltage increases or decreases between charging and discharging voltages (i.e., upon changing between charging and discharging states or between discharging and charging states). Typically, hysteresis voltage is modeled in accordance with an associated transit rate (e.g., using a first-order ordinary differential equation (ODE)).

Battery management systems and methods according to the present disclosure are configured to calculate the hysteresis voltage using multiple rates of hysteresis transit. For example, the hysteresis voltage is modeled in accordance with a weighted sum of multiple transit rates. In some examples, the hysteresis voltage is calculated further based on hysteresis relaxation. Accordingly, a battery state can be more accurately determined in accordance with the hysteresis voltage of the present disclosure.

Although described herein with respect to vehicle batteries (e.g., rechargeable batteries for electric or hybrid vehicles), the principles of the present disclosure may be applied to batteries used in non-vehicle applications.

Referring now to FIG. 1, a functional block diagram of an example vehicle system 100 including a battery pack or system 104 according to the present disclosure is shown. The vehicle system 100 may correspond to an autonomous or non-autonomous vehicle. The vehicle may be an electric vehicle (as shown). In other examples, the principles of the present disclosure may be implemented in a hybrid electric vehicle, a fuel cell electric vehicle, or a non-vehicle application.

A vehicle control module 112 controls various operations of the vehicle system 100 (e.g., acceleration, braking, etc.). The vehicle control module 112 may communicate with a transmission control module 116, for example, to coordinate gear shifts in a transmission 120. The vehicle control module 112 may communicate with the battery system 104, for example, to coordinate operation of an electric motor 128. While the example of one electric motor is provided, multiple electric motors may be implemented. The electric motor 128 may be a permanent magnet electric motor, an induction motor, or another suitable type of electric motor that outputs voltage based on back electromagnetic force (EMF) when free spinning, such as a direct current (DC) electric motor or a synchronous electric motor. In various implementations, various functions of the vehicle control module 112 and the transmission control module 116 may be integrated into one or more modules.

Electrical power is applied from the battery system 104 to the electric motor 128 to cause the electric motor 128 to output positive torque. For example, the vehicle control module 112 may include an inverter or inverter module (not shown) to apply the electrical power from the battery system 104 to the electric motor 128. The electric motor 128 may output torque, for example, to an input shaft of the transmission 120, to an output shaft of the transmission 120, or to another component. A clutch 132 may be implemented to couple the electric motor 128 to the transmission 120 and to decouple the electric motor 128 from the transmission 120. One or more gearing devices may be implemented between an output of the electric motor 128 and an input of the transmission 120 to provide one or more predetermined gear ratios between rotation of the electric motor 128 and rotation of the input of the transmission 120.

A battery management system (BMS) 136 is configured to control functions of the battery system 104 including, but not limited to, controlling switching of individual battery modules or cells of the battery system 104, monitoring operating parameters, diagnosing faults, etc. The battery management system 136 may be further configured to communicate with a telematics module 140.

The battery management system 136 according to the present disclosure is configured to calculate a battery state (e.g., including a state of charge (SOC)) of individual cells of the battery system 104 based on a hysteresis voltage model that incorporates multiple rates of hysteresis transit. In some examples, the hysteresis voltage is calculated further based on hysteresis relaxation. For example, the battery management system 136 may include (or, alternatively, communicate with) a battery state estimation module configured to estimate or calculate (e.g., model) the hysteresis voltage.

Figure 2:
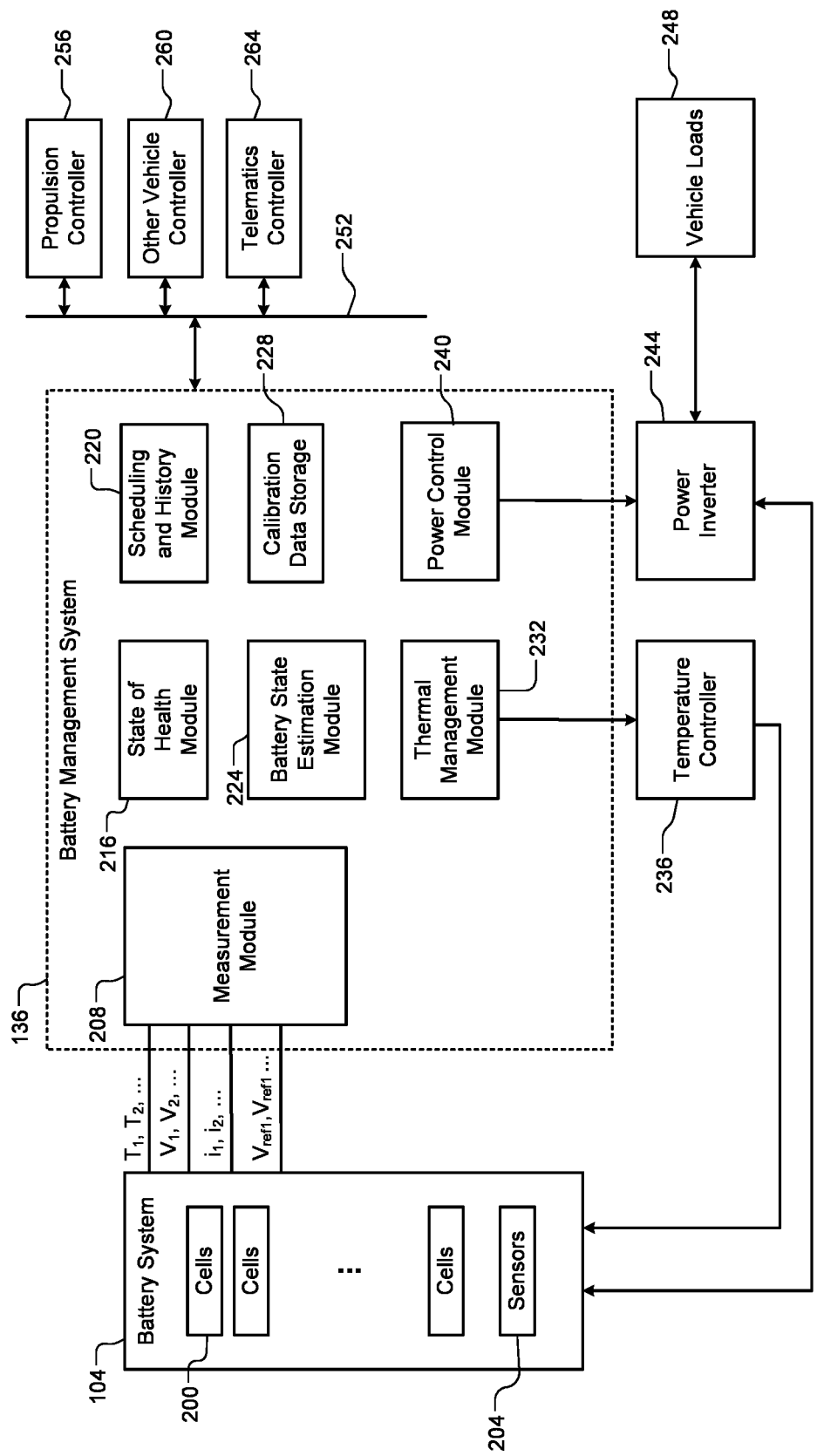
FIG. 2 is a functional block diagram of an example of a battery management system according to the present disclosure.

Referring now to FIG. 2, an example of a battery system 104 and a battery management system 136 is shown in more detail. The battery system 104 includes a plurality of battery cells 200 and one or more sensors 204 (such as voltage, current, temperature, etc.). The battery management system 136 includes a measurement module 208 that coordinates measurement of values from a battery cell and/or pack level.

Examples of values include temperatures $T_1, T_2, \ldots$, voltages $V_1, V_2, \ldots$, currents $I_1, I_2, \ldots$, reference voltages $V_{ref1}, V_{ref2}, \ldots$, etc. (e.g., corresponding to respective ones of the battery cells 200).

A state of health (SOH) module 216 calculates a SOH of the battery system 104 and/or individual ones of the battery cells 200. A scheduling and history module 220 schedules testing of the battery cells 200 at predetermined periods (e.g. operating time, cycles, etc.), in response to predetermined events and/or in response to other factors and stores historical data. A battery state estimation module 224 determines a state (e.g., the SOC) of the battery system 104 and/or the battery cells 200. The battery state estimation module 224 according to the present disclosure calculates a battery state of the battery system 104 based on a hysteresis voltage model that incorporates multiple rates of hysteresis transit and, in some examples, hysteresis relaxation as described below in more detail. Although the battery state estimation module 224 is shown within the battery management system 136, in other examples the battery state estimation module 224 may be external to the battery management system 136.

Calibration data storage 228 stores thresholds, parameters and/or other data related to calibration of the battery system. A thermal management module 232 communicates with a temperature controller 236 to control a temperature of the battery system 104 such as by adjusting coolant flow, airflow, and/or other parameters. A power control module 240 controls a power inverter 244 connecting the battery system 104 to one or more loads 248 (e.g., vehicle loads). The battery management system 136 communicates via a vehicle data bus 252 with a propulsion controller 256, one or more other vehicle controllers 260, and/or a telematics controller 264. The components and functions of the battery management system 136 as describe above are presented for example only and other examples of the battery management system may include or omit various modules and associated functions.

Figure 3:
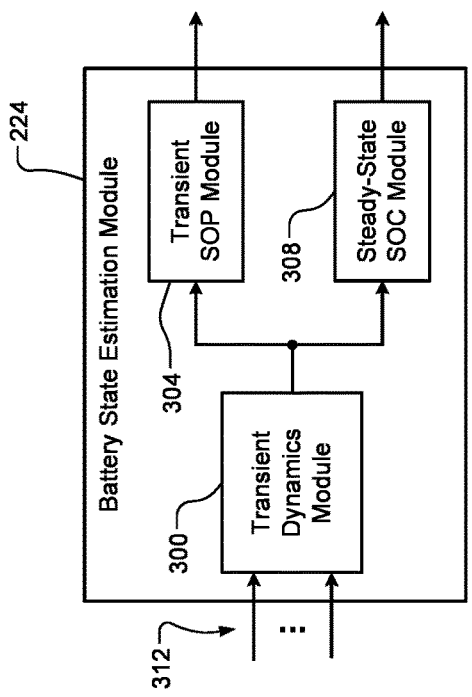
FIG. 3 is a function block diagram of an example battery state estimation module according to the present disclosure.

Referring now to FIG. 3, an example of the battery state estimation module 224 is shown in more detail. The battery state estimation module 224 includes a transient dynamics module 300, a transient state of power (SOP) module 304, and a steady-state SOC module 308. The transient SOP module 304 and the steady-state SOC module 308 receive full battery state information (which is calculated in part using a predicted voltage) calculated by the transient dynamics module 300 and calculate a transient SOP and steady-state SOC, respectively, based on the battery state.

For example, the transient dynamics module 300 implements a transient dynamics model (e.g., a model of transient dynamics) and a Kalman filter that updates the transient dynamics model based on actual battery behavior and calculates and outputs the battery state accordingly. For example, the transient dynamics module 300 receives battery measurements such as current, voltage, and temperature, updates its estimate of the battery state using these measurements and its prior estimate of the battery state, and predicts the battery voltage using the transient dynamics model. In one example, a difference between a predicted voltage and a measured voltage is used as a feedback signal to correct the battery state estimate. This correction is calculated as the product of a gain matrix and the feedback signal. In one example, the gain matrix is a Kalman gain matrix, which can be calculated by any one of several approaches known to those skilled in the art as the Extended Kalman Filter, the Sigma-Point Kalman Filter, or other related variations.

The transient dynamics module 300 is further configured to calculate the battery state of the battery system 104 using a hysteresis voltage model that incorporates multiple rates of hysteresis transit and, in some examples, hysteresis relaxation in accordance with the principles of the present disclosure. For example, the transient dynamics model of the transient dynamics module 300 calculates the SOC, equivalent constant current, overpotential, hysteresis voltage, and predicted voltage based on estimates or measurements 312 including, but not limited to, currents, temperatures, and/or voltages of the battery cells 200.

Figure 4:
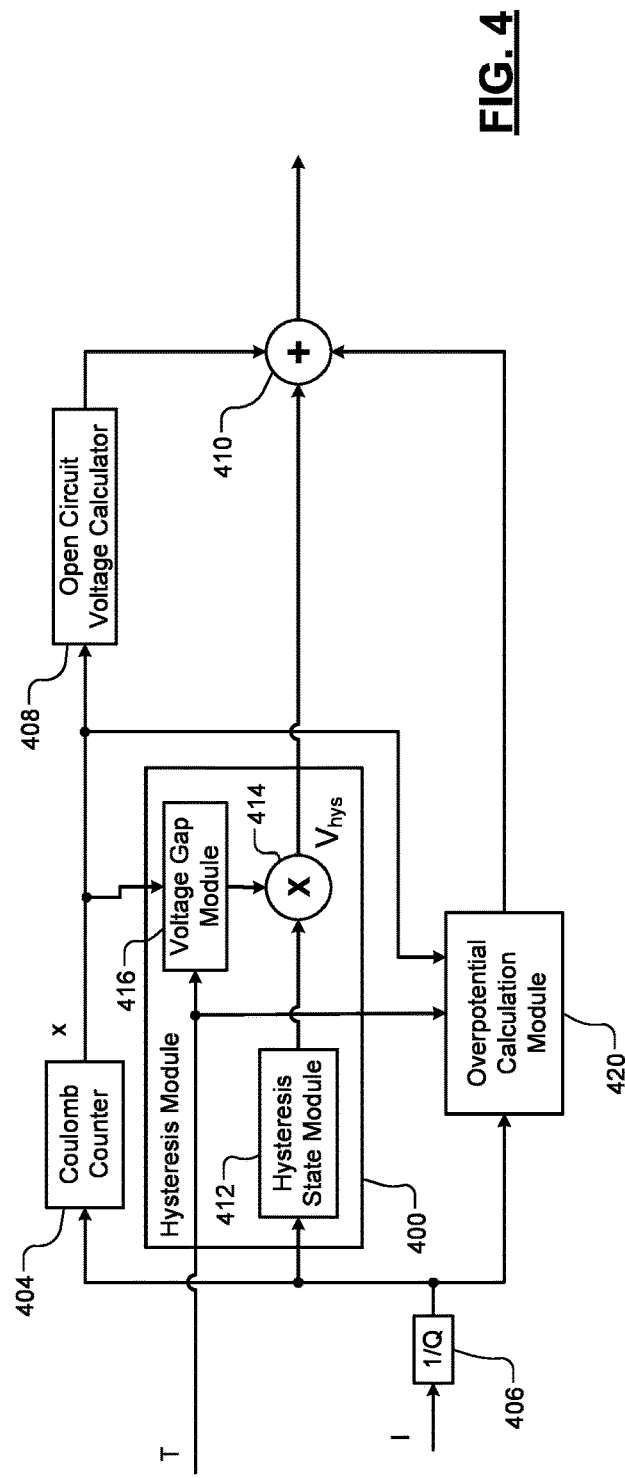
FIG. 4 is a functional block diagram of an example transient dynamics module according to the present disclosure.

Referring now to FIG. 4, an example of the transient dynamics module 300 is described in more detail. The transient dynamics module 300 receives measured battery cell temperatures T and currents I and calculates a respective state of charge SOC (e.g., based on a Coulomb count, where x=SOC), open circuit voltage $V_{OC}$, hysteresis voltage $V_{hys}$, and overpotential $V_{over}$ based on the temperature and current. For example, the transient dynamics module 300 includes a hysteresis module 400 configured to calculate the hysteresis voltage according to the principles of the present disclosure. The transient dynamics module 300 determines a predicted voltage based on (e.g., based on a sum of) the open circuit voltage, hysteresis voltage, and overpotential.

For example, the measured current is provided to an SOC calculation module (e.g., a Coulomb counter 404) configured to measure an amount of current consumption to calculate the SOC of the battery cell. The current I provided to the Coulomb counter 404 is divided by capacity Q (i.e., multiplied by 1/Q as shown at 406) to obtain the rate of change of SOC, which is often referred to as C-rate and has units of reciprocal time. The Coulomb counter 404 integrates this rate of change to obtain the present SOC, denoted x in FIG. 4. The open circuit voltage is calculated as a function of the SOC (e.g., using an open circuit voltage calculator 408, where $V_{OC}=OCV(x)$) and provided to summer 410.

The current is also provided to a hysteresis state module 412 of the hysteresis module 400, which calculates a hysteresis state corresponding to a hysteresis between charge and discharge voltages and multiple rates of hysteresis transit, where the state is +1 for steady charging, −1 for steady discharging, and has intermediate values when the direction of current changes. The hysteresis state is multiplied (e.g., using multiplier 414) by an output of a voltage gap module 416, which is configured to calculate a voltage gap $V_{gap}$ as a function of temperature and SOC. The output of the multiplier 414 is the hysteresis voltage $V_{hys}$ which is provided to summer 410.

The voltage gap corresponds to a hysteresis half-gap. A voltage required to charge a battery is greater than a voltage that is recovered from the battery during discharge. This difference is greater for fast charge and discharge (i.e., large currents) and decreases for slow charge and discharge (i.e., small currents). However, it may happen that for very slow charge and discharge the difference does not decrease to zero. A hysteresis gap is the difference between the voltage required to slowly charge the battery (a charging voltage) and the voltage recovered from the battery during a slow discharge (a discharging voltage), which may vary based on state of charge, temperature, battery type and materials, etc. Typically, if a battery rests in an open circuit state for an extended period, the battery voltage settles near a half-way point between the charging voltage and the discharging voltage, which corresponds to an open circuit voltage. The voltage gap can be calculated as a function of the open circuit voltage, the charging or discharging voltage, and a voltage overpotential. The product of the hysteresis state and the voltage gap is the hysteresis voltage and is provided to the summer 410.

An overpotential calculation module 420 is configured to calculate an overpotential based on the measured current. In some examples, the overpotential calculation module 420 calculates lagged currents based on the measured current and calculates the overpotential based on the lagged currents as described in U.S. Pat. No. 10,928,457. The overpotential is summed with the open circuit voltage and the hysteresis voltage to generate the predicted voltage.

While the term measured current is used above, in the example shown in FIG. 4 the signal input to the hysteresis module 400, the coulomb counter 404, and the overpotential calculation module 420 is shown as a C-rate (I/Q) as calculated at 406. In this example, the term C-rate replaces the measured current. The principle of operation in this example is analogous to that of a calculation using current. A formulation in terms of C-rate is preferred for scale independence and for more naturally adapting to battery degradation as the capacity Q decreases with battery age and use.

Figure 5:
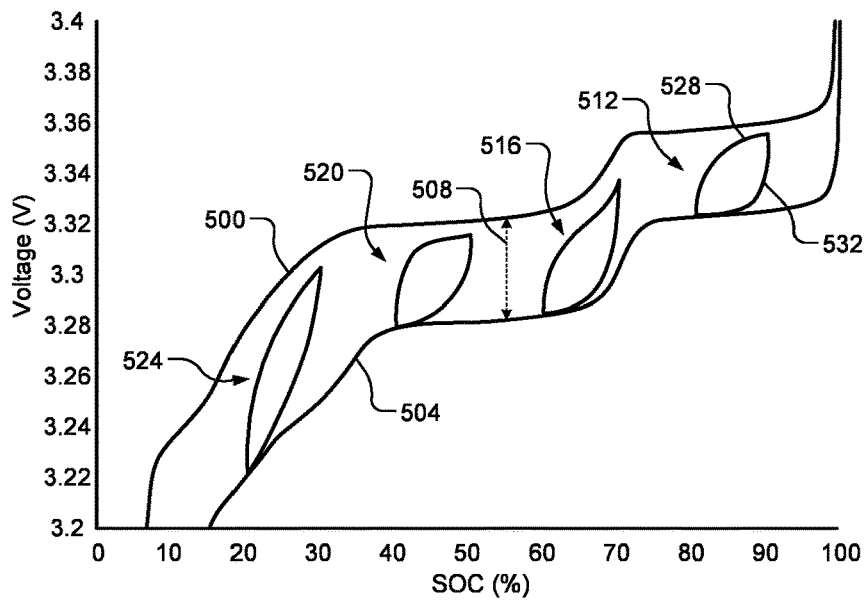
FIG. 5 illustrates different hysteresis transit rates over a range of voltages and SOCs according to the present disclosure.

FIG. 5 illustrates different hysteresis transit rates over a range of voltages and SOCs. An example battery voltage during slow charging is shown at 500. Conversely, an example, battery voltage during slow discharging is shown at 504. A gap 508 (i.e., a gap in the vertical direction) between the charging voltage and the discharging voltage corresponds to a hysteresis gap or voltage. In this example, a battery was iteratively slowly charged and slowly discharged to produce hysteresis loops. By charging and discharging slowly, the contribution of overpotential is minimal, where "slow" indicates using currents corresponding to a C-rate 1/20 h or smaller.

For example, a fully charged battery was allowed to partially discharge from 100% to 80%, charged from 80% to 90%, and then discharged to produce a hysteresis loop 512. The battery was allowed to discharge from 90% to 60%, charged from 60% to 70%, and then discharged to produce a hysteresis loop 516. The battery was allowed to discharge from 70% to 40%, charged from 40% to 50%, and then discharged to produce a hysteresis loop 520. The battery was allowed to discharge from 50% to 20%, charged from 20% to 30%, and then discharged to produce a hysteresis loop 524.

Each hysteresis loop has a charging curve and a discharging curve, as illustrated for loop 512 as curves 528 and 532, respectively. As shown, each hysteresis loop may have a different respective charging transit rate and discharging transit rate. Further, each of the charging and discharging curves may be characterized by how quickly they approach the full-range charge curve 500 or the full-range discharge curve 504, as appropriate. The decay in the difference between the charging curve 528 and the full-range charging curve 500 can be modeled as a sum of exponential decays, each decay having a characteristic decay rate which is referred to as a hysteresis transit rate. The decay in the difference between discharging curve 532 and the full-range discharge curve 504 can be similarly modeled as a sum of exponential decays each having a characteristic hysteresis transit rate. Accordingly, modeling hysteresis voltage in accordance with a single hysteresis transit rate may not result in an accurate hysteresis across an entire range of possible charging and discharging voltages and SOCs.

The hysteresis state module 412 according to the present disclosure models hysteresis voltage using multiple hysteresis transit states, each such state having a characteristic hysteresis transit rate. For example, the hysteresis state module 412 may identify and incorporate multiple hysteresis transit states having transit rates $k_i$ (e.g., $k_1$, $k_2$, $k_3$, etc.) Each hysteresis transit state may be assigned a respective weight. As one example, over an entire range of voltage and/or SOC values and other conditions (e.g., temperature), the first hysteresis state may have a first transit rate $k_1$ (e.g., 1%) and this state contributes a first percentage of the total hysteresis voltage (e.g., 66%) while a second hysteresis state may have a second transit rate $k_2$ (e.g., 15%) and contributes a second percentage of the total hysteresis voltage (e.g., 34%). Accordingly, each transit rate is assigned a weight (e.g., 0.66 for $k_1$ and 0.34 for $k_2$). The hysteresis state module 412 is configured to calculate a hysteresis state based on a sum of the weighted transit rates as described below in more detail.

Figure 6:
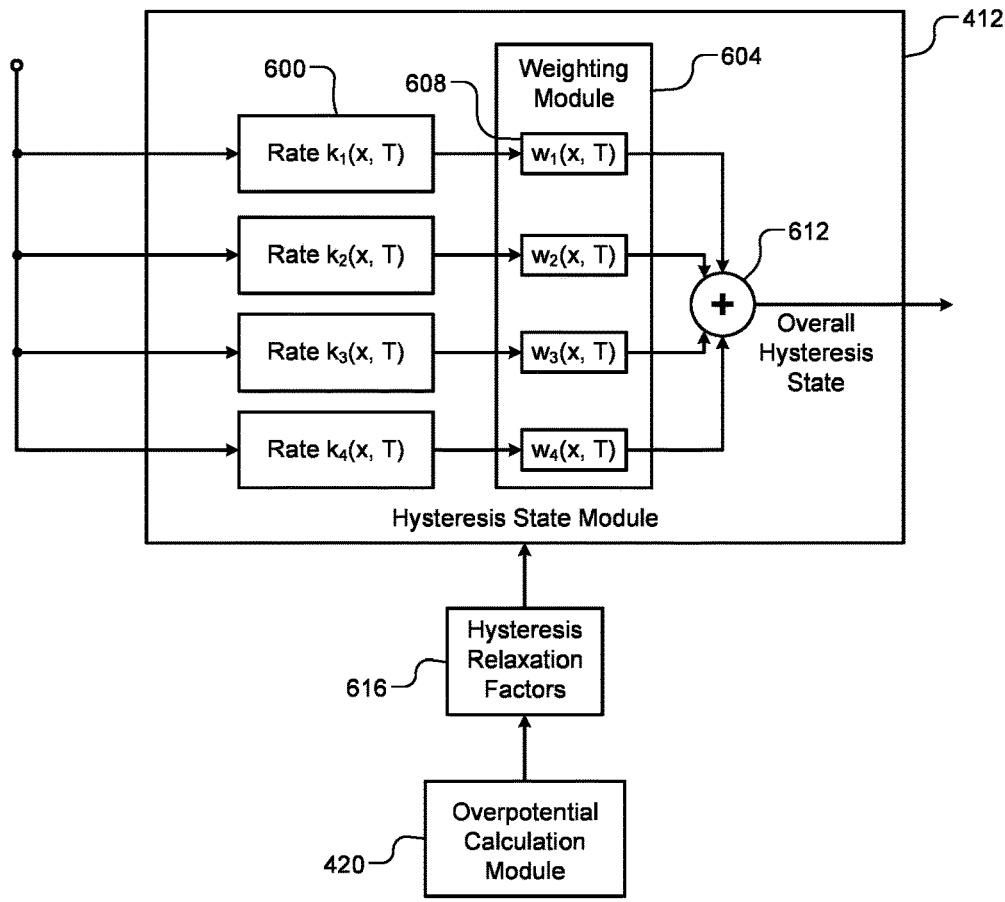
FIG. 6 is a functional block diagram of an example of the hysteresis state module according to the present disclosure.

Referring now to FIG. 6, an example of the hysteresis state module 412 according to the present disclosure is shown in more detail. For example, rate modules 600 receive the measured current (or, in some examples, a C-rate as described above) and apply a respective rate k to the measured current to generate respective hysteresis state components (e.g., transit variables $ς_i$). Although four of the rate modules 600 are shown to generate four respective hysteresis state components (e.g., by applying rates $k_1$-$k_4$), in other examples more or fewer rate modules and respective rates may be used. Each hysteresis state component may be calculated based on the measured current and a respective transit rate k (e.g., as a function of voltage x and temperature T). As one example, each hysteresis state component is a transit variable calculated in accordance with $k_i \dot{ς}_i = I - |I| ς_i$, where $\dot{ς}_i$ is a time-derivative of the transit variable. (Equation 1)

A weighting module 604 receives the hysteresis state components and applies a respective weighting factor to the hysteresis state components (e.g., multiplies the hysteresis state components by respective weighting factors 608) and outputs weighted hysteresis state components. The weighted hysteresis state components are summed (e.g., at summer 612) to generate a weighted sum, which corresponds to the overall hysteresis state.

The weighting factors 608 are calibrated weights selected such that $\Sigma_i w_i(x, T) = 1$. In this manner, the calculated hysteresis state is a hysteresis state that incorporates multiple hysteresis rates of transit k. The hysteresis state is multiplied with the output of the voltage gap calculator 416 to generate the hysteresis voltage.

In some examples, the hysteresis state module 412 calculates the hysteresis state further based on hysteresis relaxation. During charging and discharging transitions, a hysteresis voltage calculated by a model moves toward an opposite side of the hysteresis gap 508 described above and may be relatively constant when the battery is in an open circuit state. For example, when the battery is charged with a first, relatively large current and then switched to an open circuit state, hysteresis relaxes (i.e., settles) a first amount. Conversely, if the battery is charged at a second, relatively small current (i.e., less than the first current), hysteresis relaxes a second amount that is less than the first amount. In other words, hysteresis relaxes in a manner that is dependent upon the magnitude of the charging current. Hysteresis relaxation subsequent to discharge is similarly depending upon magnitude of discharge current.

The hysteresis state module 412 according to the present disclosure calculates the hysteresis state further based on hysteresis relaxation factors 616 that vary in accordance with current. For example, the hysteresis state module 412 is configured output the hysteresis state based on an absolute value of the current and a weighted time average of recent current values (e.g., lagged currents as described above).

As one example, in contrast to Equation 1 above, the rate modules 600 are configured to calculate the transit variables in accordance with $$k_i \dot{\varsigma}_i = I - \varsigma_i \sqrt{s_{i0}I^2 + s_{i1}u_1^2 + \ldots + s_{in}u_n^2 + \varepsilon_i^2}$$ (Equation 2), or as a variant, in accordance with $$k_i \dot{\varsigma}_i = I - \varsigma_i \sqrt{s_{i0}I^2 + s_{i1}(I-u_1)^2 + \ldots + s_{in}(I-u_n)^2 + \varepsilon_i^2}$$ (Equation 3), where I is current (or C-rate), $s_{i0}, \ldots, s_{in}$ are relaxation weights assigned to different lagged currents $u_k$, and $\varepsilon_i$ is a decay parameter. In this example, each of the relaxation weights and the decay parameter are positive values and may be dependent upon SOC and temperature.

In the example of Equation 1, if the measured current I is 0 (i.e., the battery is not in a charging or discharging state), outputs of the rate modules 600 are also 0. Conversely, in the examples of Equation 2 or Equation 3, each of the lagged currents and corresponding relaxation values still affects the output of the equation even if the value of the measured current is 0. In other words, even after the battery transitions from charging or discharging to a steady state and current is 0, outputs of the rate modules 600 may be nonzero in accordance with recent current values (i.e., the lagged currents) and their associated relaxation weights.

Figure 7:
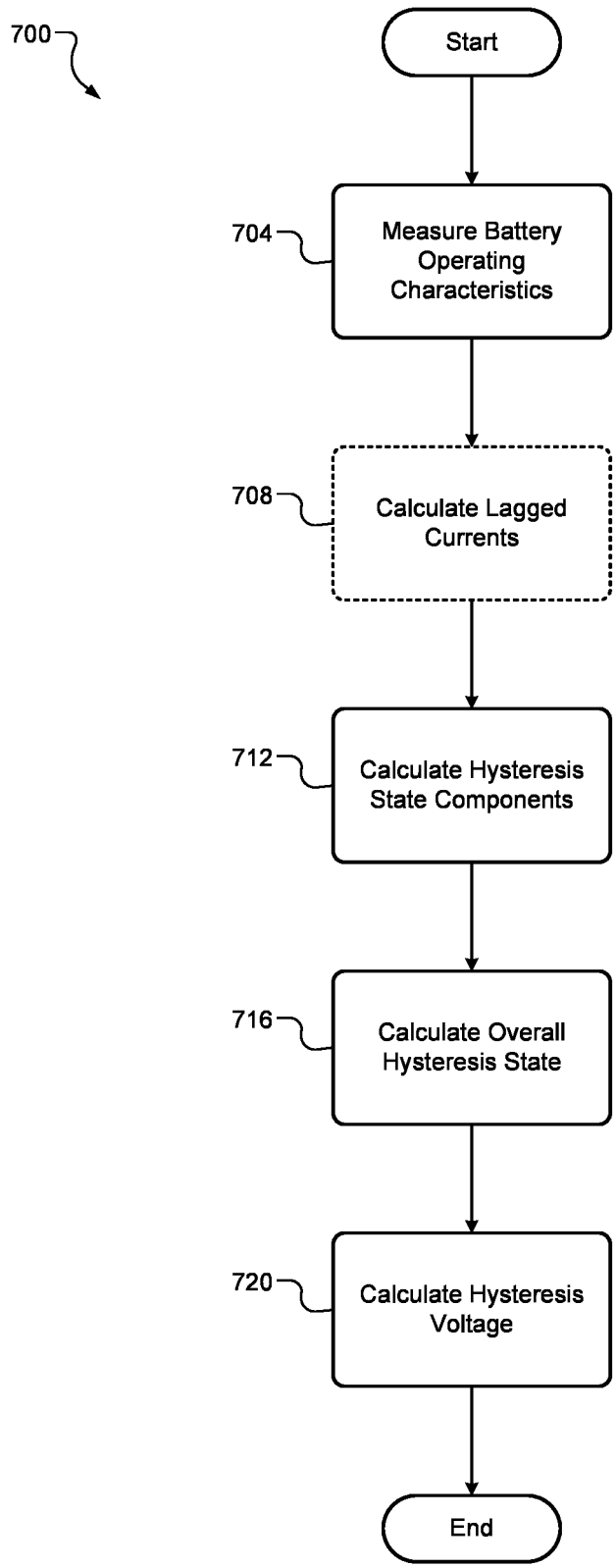
FIG. 7 illustrates steps of an example method for calculating a hysteresis voltage of a battery according to the present disclosure.

Referring now to FIG. 7, an example method 700 (e.g., as implemented by the battery management system 136, battery estimation module 224, transient dynamics module 300, etc.) for calculating hysteresis voltage according to the present disclosure is shown. At 704, the method 700 measures one or more battery operating characteristics indicative of hysteresis voltage, such as measured current, voltage, and temperature. At 708, the method 700 optionally calculates lagged currents based on the measured current (e.g., for examples where relaxation factors of lagged currents are used).

At 712, the method 700 calculates a plurality of hysteresis state components (e.g., transit variables) based on the measured current. For example, the transit variables are calculated in accordance with respective ones of multiple hysteresis transit rates. In some examples, the transit variables are calculated further based on a plurality of relaxation weights assigned to respective lagged currents calculated at 708.

At 716, the method 700 calculates an overall hysteresis state based on the plurality of hysteresis state components. For example, the overall hysteresis state is a weighted sum of the hysteresis state components. In one example, the method 700 calculates the weighted sum based on respective weighting factors and a sum of the weighting factors is 1.

At 720, the method 700 calculates the hysteresis voltage overpotential based in part on the hysteresis state. For example, the method 700 calculates the hysteresis voltage based on a product of the hysteresis state and a voltage gap as described above in FIG. 4.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A vehicle, comprising a system the system comprising:
a hysteresis module configured to:
calculate a plurality of hysteresis state components of a battery of the vehicle based on a measured current, wherein the hysteresis module calculates each of the plurality of hysteresis state components based on a respective hysteresis transit rate,
calculate an overall hysteresis state of the battery based on the plurality of hysteresis state components, and
calculate a hysteresis voltage of the battery based on the overall hysteresis state; and
a state of charge (SOC) module configured to calculate an SOC of the battery based in part on the hysteresis voltage.

2. The vehicle of claim 1, wherein the hysteresis module is configured to calculate the plurality of hysteresis state components based on a C-rate associated with the measured current.

3. The vehicle of claim 1, wherein the hysteresis module includes a plurality of rate modules configured to output the plurality of hysteresis state components based on the hysteresis transit rates.

4. The vehicle of claim 3, wherein the plurality of hysteresis state components are transit variables.

5. The vehicle of claim 1, wherein the hysteresis module is configured to calculate the plurality of hysteresis state components based on lagged currents associated with the measured current.

6. The vehicle of claim 5, wherein the hysteresis module is configured to calculate the plurality of hysteresis components based on respective relaxation factors assigned to the lagged currents, wherein the relaxation factors correspond to relaxation of hysteresis voltage subsequent to stopping charging or discharging of the battery.

7. The vehicle of claim 6, wherein the relaxation factors are relaxation weights.

8. The vehicle of claim 1, wherein the hysteresis module is configured to calculate the overall hysteresis state based on a weighted sum of the plurality of hysteresis state components.

9. The vehicle of claim 8, wherein the hysteresis module is configured to calculate the weighted sum based on a plurality of weighting factors, and wherein a sum of the plurality of weighting factors is 1.

10. The vehicle of claim 1, wherein the hysteresis module is configured to calculate the hysteresis voltage further based on a voltage gap.

11. The vehicle of claim 10, wherein the hysteresis module is configured to calculate the hysteresis voltage based on a product of the hysteresis state and the voltage gap.

* * * * *